United States Patent
Tang et al.

(10) Patent No.: US 11,322,647 B2
(45) Date of Patent: May 3, 2022

(54) BURIED CONTACT LAYER FOR UV EMITTING DEVICE

(71) Applicant: Silanna UV Technologies Pte Ltd, Singapore (SG)

(72) Inventors: Johnny Cai Tang, Baulkham Hills (AU); Chun To Lee, West Ryde (AU); Guilherme Tosi, Yeerongpilly (AU); Christopher Flynn, Cherrybrook (AU); Liam Anderson, Wentworth Point (AU); Timothy William Bray, Vancouver (CA); Petar Atanackovic, Henley Beach South (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 128 days.

(21) Appl. No.: 16/864,838

(22) Filed: May 1, 2020

(65) Prior Publication Data

US 2021/0343896 A1    Nov. 4, 2021

(51) Int. Cl.
*H01L 33/06* (2010.01)
*H01L 33/38* (2010.01)
(Continued)

(52) U.S. Cl.
CPC .......... *H01L 33/06* (2013.01); *H01L 33/0025* (2013.01); *H01L 33/32* (2013.01);
(Continued)

(58) Field of Classification Search
CPC ....... H01L 33/12; H01L 33/145; H01L 33/06; H01L 33/38; H01L 33/0025; H01L 33/32
See application file for complete search history.

(56) References Cited

U.S. PATENT DOCUMENTS

| 2011/0168977 A1 | 7/2011 | Eichler et al. |
| 2013/0009130 A1 | 1/2013 | Chen et al. |

(Continued)

FOREIGN PATENT DOCUMENTS

| JP | 2000244070 A | 9/2000 |
| JP | 2012146847 A | 8/2012 |

(Continued)

OTHER PUBLICATIONS

International Search Report and Written Opinion dated Jul. 28, 2021 for PCT Patent Application No. PCT/IB2021/053466.

*Primary Examiner* — Savitri Mulpuri
(74) *Attorney, Agent, or Firm* — MLO, a professional corp.

(57) ABSTRACT

In some embodiments, a light emitting structure comprises a layered semiconductor stack comprising a first set of doped layers, a second layer, a light emitting layer positioned between the first set of doped layers and the second layer, and an electrical contact to the first set of doped layers. The first set of doped layers can comprise a first sub-layer, a second sub-layer, and a third sub-layer, where the third sub-layer is adjacent to the light emitting layer. The electrical contact to the first set of doped layers can be made to the second sub-layer. The first, second and third sub-layers can be doped n-type, and an electrical conductivity of the second sub-layer can be higher than an electrical conductivity of the first and third sub-layers. In some cases, the second sub-layer can absorb more light emitted from the light emitting layer than the first or third sub-layers.

9 Claims, 9 Drawing Sheets

(51) Int. Cl.
  *H01L 33/00* (2010.01)
  *H01L 33/32* (2010.01)
  *H01L 33/14* (2010.01)
  *H01L 33/12* (2010.01)
(52) U.S. Cl.
  CPC .............. *H01L 33/38* (2013.01); *H01L 33/12* (2013.01); *H01L 33/145* (2013.01)

(56) References Cited

U.S. PATENT DOCUMENTS

| | | | |
|---|---|---|---|
| 2013/0228743 A1* | 9/2013 | Fu | H01L 33/06 257/13 |
| 2014/0367636 A1 | 12/2014 | Chua | |
| 2016/0149074 A1 | 5/2016 | Atanackovic et al. | |
| 2016/0225950 A1 | 8/2016 | Han et al. | |
| 2018/0240936 A1 | 8/2018 | Hong et al. | |
| 2019/0115497 A1 | 4/2019 | Zhang et al. | |
| 2019/0237616 A1* | 8/2019 | Anderson | H01L 33/06 |
| 2019/0362967 A1* | 11/2019 | Zhao | H01L 21/02507 |
| 2020/0075800 A1* | 3/2020 | Ye | H01L 33/0075 |
| 2021/0050474 A1* | 2/2021 | Krause | H01L 33/0041 |
| 2021/0151360 A1* | 5/2021 | Venkatasubramanian | H01L 35/16 |

FOREIGN PATENT DOCUMENTS

| | | |
|---|---|---|
| KR | 20170124439 A | 11/2017 |
| WO | 2019069834 A1 | 4/2019 |
| WO | 2019193487 A1 | 10/2019 |
| WO | 2020012392 A1 | 1/2020 |

\* cited by examiner

BURIED CONTACT LAYER FOR UV EMITTING DEVICE

BACKGROUND

Deep ultraviolet (deep-UV) light emitting diodes (LEDs) have enormous potential for sterilization, water treatment, scientific analysis and other applications. However, the performance of conventional ultraviolet C-band (UVC) LEDs has been plagued by high turn-on and drive voltages. High bandgap semiconductor materials are used to emit the high energy UVC light in conventional LEDs. However, high bandgap materials are also difficult to efficiently dope n-type or p-type and therefore contacts made to high bandgap materials typically suffer from low conductivity. The low conductivity of the high bandgap materials used in UVC LEDs is one factor that contributes to the high drive voltages required, especially for devices that emit light through wide bandgap n-type semiconductors used for the n-contact.

For example, conventional UVC LEDs utilizing wurtzite semiconductors typically use AlGaN with high Al content in the active layer that emits the UVC light. Some such devices use a quantum well structure with lower Al content wells and higher Al content barriers in the active layer. In some cases, conventional LEDs emit light through the edge of the device or through the p-side of the structure. In these cases, the emitted light does not need to pass through the n-type contact layer and a low bandgap material with high conductivity can be used for an n-contact layer in the structures. In conventional devices where the light is emitted through the n-side of the structure, high bandgap optically transparent materials with lower conductivity are used for the n-contact layer. However, the low conductivity of these high bandgap materials degrades the performance of the device, for example, by increasing the turn-on and drive voltages required to operate the device.

SUMMARY

In some embodiments, a light emitting structure comprises a layered stack comprising a first set of doped layers, a second layer, a light emitting layer positioned between the first set of doped layers and the second layer, and an electrical contact to the first set of doped layers, where the first set of doped layers, the second layer, and the light emitting layer comprise semiconductor materials. In some cases, the first set of doped layers comprises a first sub-layer, a second sub-layer, and a third sub-layer, where the third sub-layer is adjacent to the light emitting layer. The first, second and third sub-layers can comprise a first, second and third superlattice, respectively. The well layers of the second superlattice can be thicker than well layers of the first and third superlattices. The barrier layers of the second superlattice can be thinner than barrier layers of the first and third superlattices. The electrical contact to the first set of doped layers can be made to the second sub-layer. The first, second and third sub-layers can be doped n-type, and the electrical conductivity of the second sub-layer can be higher than the electrical conductivity of the first and third sub-layers.

In some embodiments, a light emitting structure comprises a layered stack comprising a first set of doped layers, a second layer, a light emitting layer positioned between the first set of doped layers and the second layer, and an electrical contact to the first set of doped layers, where the first set of doped layers, the second layer, and the light emitting layer comprise semiconductor materials. The first set of doped layers can comprise a first sub-layer, a second sub-layer, and a third sub-layer, where the third sub-layer is adjacent to the light emitting layer. The electrical contact to the first set of doped layers can be made to the second sub-layer. The first, second and third sub-layers can be doped n-type, and an electrical conductivity of the second sub-layer can be higher than an electrical conductivity of the first and third sub-layers. The first, second and third sub-layers can comprise a first, second and third superlattice, respectively. The light emitting layer can comprise a fourth superlattice, and the second layer can comprise a fifth superlattice. The first, second, third, fourth, and fifth superlattices can each comprise sets of GaN well layers and AlN barrier layers.

In some embodiments, a light emitting structure comprises a layered stack comprising a first set of doped layers, a second layer, a light emitting layer positioned between the first set of doped layers and the second layer, and an electrical contact to the first set of doped layers, where the first set of doped layers, the second layer, and the light emitting layer comprise semiconductor materials. The first set of doped layers can comprise a first sub-layer, a second sub-layer, and a third sub-layer, where the third sub-layer is adjacent to the light emitting layer. The electrical contact to the first set of doped layers can be made to the second sub-layer. The first, second and third sub-layers can be doped n-type, and the electrical conductivity of the second sub-layer can be higher than the electrical conductivity of the first and third sub-layers. Light with a wavelength shorter than 300 nm can be emitted from the light emitting layer and can pass through the first set of doped layers before being emitted from the structure, and the second sub-layer can absorb more light emitted from the light emitting layer than the first or third sub-layers.

DETAILED DESCRIPTION

Figure 1:
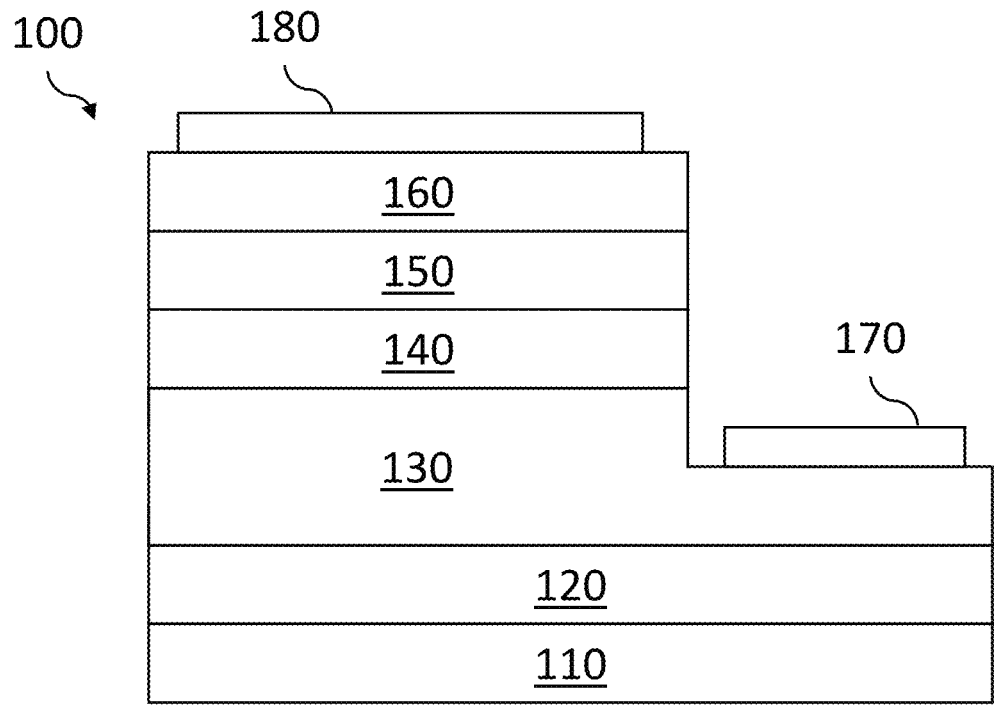
FIG. 1 shows a simplified schematic of a conventional semiconductor structure.

A buried layer inserted as an n-contact layer in semiconductor epitaxial structures is described herein. The semiconductor epitaxial structures described herein can be used in light emitting diodes (LEDs) that emit at short wavelengths (e.g., in the UVC band, or with wavelengths less than 300 nm). The present buried layers have a high n-type conductivity, which is beneficial for current injection into the active layer of the structure from the n-contact. The high conductivity material of the buried layer also has a high absorption coefficient in the wavelength range of interest (e.g., at wavelengths below 300 nm). The thickness of the buried layer is therefore tailored to have an acceptable amount of optical absorption in the buried layer and an acceptable electrical resistance (i.e., between the n-contact and an active layer of the structure). In other words, the thickness of the buried layer is tailored to improve the performance of the device (e.g., the turn-on voltage, drive voltage, and the output power efficiency) compared to conventional structures by trading off increased absorption with decreased layer resistance. In some embodiments, fine epitaxial growth thickness control is used to form the buried n-contact layer with the correct thickness, and a precise etch process is used to expose the n-contact layer so that an n-metal can be deposited thereon.

In some embodiments, a semiconductor epitaxial structure contains a first set of doped layers, a second layer, and a light emitting layer positioned between the first set of doped layers and the second layer. The first set of doped layers is n-type doped, and an n-type electrical contact (i.e., using an n-metal) is made to the first set of doped layers. The first set of doped layers provides a buried n-contact layer of high conductivity with an acceptable optical transparency (to the wavelength of light emitted) that allows a low drive voltage to be obtained without significantly reducing the output power. In some cases, the buried n-contact layer enables the output power of the structure to be increased compared to a structure with a lower conductivity transparent n-contact layer.

In some embodiments, the first set of doped layers comprises a first sub-layer, a second sub-layer, and a third sub-layer, where the third sub-layer is adjacent to the light emitting layer (i.e., so that the second sub-layer is "buried" beneath the third sub-layer, or the third sub-layer is between the active layer and the second sub-layer). The second sub-layer is the n-contact layer, i.e., the second sub-layer is the layer in the structure that is connected to an n-metal contact. The second sub-layer can have a higher doping density and/or a higher electrical conductivity than the first and third sub-layers. In some embodiments, the second sub-layer has a higher absorption coefficient to the light emitted from the light emitting layer than the first or third sub-layers. In some embodiments, the second sub-layer can be positioned between the first and third sub-layers, or the first sub-layer can be positioned between the second and third sub-layers.

In some embodiments, the buried n-contact layer has the following characteristics. First, the buried n-contact layer can be deposited using the same epitaxial growth process as the rest of the layers in the structure, which allows it to be readily integrated into the structure fabrication. Second, the buried n-contact layer is more conductive than the surrounding layers (e.g., the first and third sub-layers described above), which improves current injection compared to a similar device without a high conductivity n-contact. Third, the buried n-contact layer can be made thin enough that it absorbs an acceptable amount of the light emitted from an active layer in the structure (e.g., the buried n-contact layer absorbs less than 60%, less than 50%, less than 40%, or less than 30% of the emitted light, or from 10% to 50%, or from 10% to 60% of the emitted light), and the layer is not too thin to be readily accessed through an etching process to expose the buried n-contact layer (e.g., the buried n-contact layer is thicker than about 10 nm, or thicker than about 20 nm).

In some embodiments, the semiconductor epitaxial structures described herein are grown using molecular beam epitaxy (MBE), metal organic chemical vapor deposition (MOCVD), or hydride vapor phase epitaxy (HVPE). In some embodiments, the buried n-contact layer is doped during the formation of the epitaxial structure (e.g., using one or two dopant sources in an MBE system). Subsequent to growing the semiconductor epitaxial structure, standard semiconductor fabrication methods can be used to process the semiconductor epitaxial structures, including etching to form mesa structures (e.g., using a dry etch) and metal deposition to deposit the n- and p-metal contacts (e.g., using evaporation or sputtering). In some embodiments, the n-contact layer can be processed after epitaxial growth in order to increase the conductivity and/or doping density of the layer. For example, laser or thermal processing can be used to improve the dopant activation in the layer. In some embodiments, such laser or thermal processing can be performed during the epitaxial growth process, for example, during a growth pause right after forming the buried n-contact layer. In some embodiments, ion implantation can also be used to increase the doping density of the layer.

In some embodiments, the first, second and third sub-layers of the first set of doped layers are each single layers of semiconductor materials. In some embodiments, the first and third sub-layers contain semiconductors with higher bandgaps than the semiconductor of the second sub-layer. Since lower bandgap materials are typically more efficiently doped (e.g., with an extrinsic dopant), the lower bandgap of the second sub-layer will enable that layer to be doped higher and have a higher electrical conductivity than the first or the third sub-layers. However, the lower bandgap can also cause the optical absorption (at the emitted wavelength) of the second sub-layer to be higher than the optical absorption of the first and third sub-layers, in some cases, which will reduce the amount of light emitted from the structure. The higher electrical conductivity of the second sub-layer will reduce the drive voltage required (for a certain amount of current injection) by reducing the resistance between the n-metal contact and the active layer of the device (i.e., it will be easier to inject carriers from the n-contact into the active layer). In the present embodiments, the thickness of the second sub-layer is specifically tuned such that the performance degradation due to the increased absorption in the second sub-layer can be offset by the improved carrier injection, and, unexpectedly, the overall device output power can be approximately the same or even improved compared to a structure where the second sub-layer has the same bandgap as the first and third sub-layers.

For example, the first and third sub-layers can be $Al_xGa_{1-x}N$ (i.e., AlGaN) with $0 \leq x \leq 1$, and the second sub-layer can be AlGaN with a lower Al content (i.e., with a lower value of x in the $Al_xGa_{1-x}N$ material) than the first and third sub-layers. In other words, the first and third sub-layers can be single layers of $Al_xGa_{1-x}N$ and the second sub-layer can be a single layer of $Al_yGa_{1-y}N$, and x can be greater than y. In some embodiments, the first, second and third sub-layers are single layers with different compositions from each other, where the second sub-layer has a lower bandgap than the first and the third sub-layers. For example, the first sub-layer can be $Al_xGa_{1-x}N$ with $0 \leq x \leq 1$, the second sub-layer can be a single layer of $Al_yGa_{1-y}N$, the third sub-layer can be $Al_zGa_{1-z}N$ with $0 \leq z \leq 1$, x can be greater than y, x can be greater than z, and y and z can be different from one another. In some embodiments, AlGaN with a lower Al content reduces the bandgap of that layer making it more efficiently doped (e.g., with an extrinsic dopant such as Si, Ge or Se), the lower Al content of the second sub-layer will enable that layer to be doped higher and have a higher electrical conductivity than the first or the third sub-layers. However, the reduced bandgap of the second sub-layer can also increase the optical absorption (at the emitted wavelength) of the second sub-layer compared to the first and third sub-layers. The composition of such sub-layers can be different depending on the wavelength of light emitted from the structure. For example, if the emission wavelength is 290 nm, then the first and third sublayers can be $Al_xGa_{1-x}N$ with x approximately equal to 0.45, and the second sub-layer can be $Al_yGa_{1-y}N$ with y approximately equal to 0.1. In such a structure, the first and third sub-layers can minimally absorb the 290 nm light, and the low bandgap of the second sub-layer can improve the conductivity of that sub-layer. However, the low Al content of the second sub-layer will cause that layer to absorb some of the 290 nm emitted light. In another example, if the emission wavelength is 250 nm, then the first and third sublayers can be $Al_xGa_{1-x}N$ with x approximately equal to 0.6, and the second sub-layer can be $Al_yGa_{1-y}N$ with y approximately equal to 0.1. In this structure, the higher Al content of the first and third sub-layers can allow them to minimally absorb the shorter wavelength 250 nm light. In this example, the low bandgap of the second sub-layer can improve the conductivity of that sub-layer, however, the low Al content of the second sub-layer will also cause that layer to absorb some of the 250 nm emitted light. In both of the above examples, the y value of 0.1 in the second sub-layer is approximate, and higher or lower y values can provide different degrees of conductivity and absorption, which can be tuned for different structures (e.g., by changing the composition and/or the thickness of the second sub-layer). Additionally, the compositions for the wavelengths in these examples are approximate, in part due to the variation of bandgap and absorption coefficient for AlGaN compounds that are fabricated using different growth techniques. In these examples, the high conductivity of the second sub-layer can improve the operating voltage of the structures compared to structures without the second sub-layer. Furthermore, in these examples, by tuning the thickness of the second sub-layer, the performance degradation due to the increased absorption in the second sub-layer can be offset by the improved carrier injection, and, unexpectedly the overall device output power can be approximately the same or even improved compared to a structure where the second sub-layer has the same Al content as the first and third sub-layers.

In some embodiments, the first, second and third sub-layers of the first set of doped layers each contain superlattices with well and barrier layers composed of semiconductor materials, where the well layers have lower bandgaps than the barrier layers. The semiconductors and/or thicknesses of the wells and/or barriers making up the superlattice of the second sub-layer can be different from those making up the superlattices of the first and/or third sub-layers, which can enable the second sub-layer to have a higher conductivity than the first and/or third sub-layers. In some embodiments, the second sub-layer (i.e., the n-contact layer) is a single layer, while the first and third sub-layers are superlattices. In some embodiments, the second sub-layer (i.e., the n-contact layer) is a superlattice, while the first and third sub-layers are each single layers. In some embodiments, one of the first, second and third sub-layers are superlattices and the other two are single layers. In some embodiments, two of the first, second and third sub-layers are superlattices and the other layer is a single layer. For example, the third sub-layer can be a single layer (e.g., of AlN or AlGaN), while the first sub-layer is a superlattice, and the second sub-layer is either a single layer or a superlattice. Additionally, in some embodiments, the third sub-layer contains a superlattice that has a thick barrier layer adjacent to the active layer. For example, the third sub-layer can contain a superlattice with repeating unit cells containing wells (e.g., composed of GaN or AlGaN) and barriers (e.g., composed of AlN, or AlGaN), where the barrier thickness is not constant through the superlattice, and the last barrier can be very thick (e.g., greater than 1 nm, or greater than 10 nm).

In some embodiments, the semiconductors making up the wells and/or barriers of the second sub-layer superlattice have lower bandgaps than those making up the first and/or third sub-layer superlattices. In some embodiments, the well layers of the second sub-layer superlattice are thicker than well layers of the first and/or third sub-layer superlattices, and/or the barrier layers of the second sub-layer superlattice are thinner than barrier layers of the first and/or third sub-layer superlattices. In some embodiments, the bandgaps of the semiconductors making up the wells and/or barriers are lower, the wells are thicker, and/or the barriers are thinner in the second sub-layer superlattice compared to the first and/or third sub-layer superlattices.

In all of the above cases, the effective bandgap of the second sub-layer superlattice can be lower than the effective bandgap of the first and third sub-layer superlattices. The wells and barriers of a superlattice can create minibands, and the effective bandgap can reflect the optical and electronic properties of the whole superlattice including the effects of the minibands. The effective bandgap of the second sub-layer is lower than that of the first and/or third sub-layers because the second sub-layer superlattice has lower bandgap materials, and/or a higher fraction of lower bandgap material than the first or the third sub-layer superlattices. Additionally, in cases where the second sub-layer superlattice has thicker wells and/or thinner barriers, the carriers will be less confined within the wells. In other words, the superlattice minibands in the second sub-layer occur at lower energies than those of the first and third sub-layer superlattices, which will allow for transitions between minibands to occur at lower energies and will effectively reduce the bandgap (and can increase the optical absorption at wavelengths of interest) compared to those of the first and third sub-layer superlattices.

Since lower bandgap materials are typically more efficiently doped (e.g., with an extrinsic dopant), the lower effective bandgap of the second sub-layer will enable that layer to be doped higher and have a higher electrical conductivity than the first or the third sub-layers. However, the lower effective bandgap can also cause the optical absorption (at the emitted wavelength) of the second sublayer to be higher than the optical absorption of the first and third sub-layers. Due to similar reasons as those described above, the higher electrical conductivity of the second sub-layer will reduce the device turn-on and drive voltages by reducing the resistance between the n-metal contact and the active layer of the device (i.e., it will be easier to inject carriers from the n-contact into the active layer). In this case, if the thickness of the second sub-layer is tuned properly then the performance degradation due to the increased absorption in the second sub-layer can be offset by the improved carrier injection and, unexpectedly, the overall device output power can be approximately the same or even improved compared to a structure where the second sub-layer has the same effective bandgap as the first and third sub-layers.

FIG. 1 is a simplified schematic of a conventional semiconductor light emitting structure 100. Structure 100 contains a substrate 110, a buffer layer 120, an n-contact layer 130, an active layer 140, an optional layer 150, and a p-contact layer 160. The optional layer 150 can be configured as an electron blocking layer (EBL) in some cases. An n-metal 170 makes contact to the n-contact layer 130, and a p-metal 180 makes contact to the p-contact layer 160. An external bias can be applied between the metal contacts 170 and 180, which can cause the active layer 140 to emit light, e.g., in the UVC wavelength band. In order to expose the n-contact layer 130 to be contacted by n-metal 170, an etching process is used to partially etch through n-contact layer 130, creating a mesa structure. After the n-contact layer 130 is exposed by the etch, n-metal 170 can be deposited on the n-contact layer 130. In the structure 100 the n- and p-metals cover a significant portion of the surface of structure 100 opposite the substrate 110, and therefore the structure 100 can emit light from the edge of the device, or can emit light through the n-contact layer 130, the buffer layer 120 and the substrate 110. As discussed above, in conventional structures that emit light through the n-side of the structure, the n-contact layer 130 is typically a wide bandgap material with low optical absorption of the emitted light, and due to the wide bandgap also typically has a relatively high electrical resistance. As a result, such conventional UVC LEDs suffer from low performance including high turn-on and drive voltages.

Figure 2:
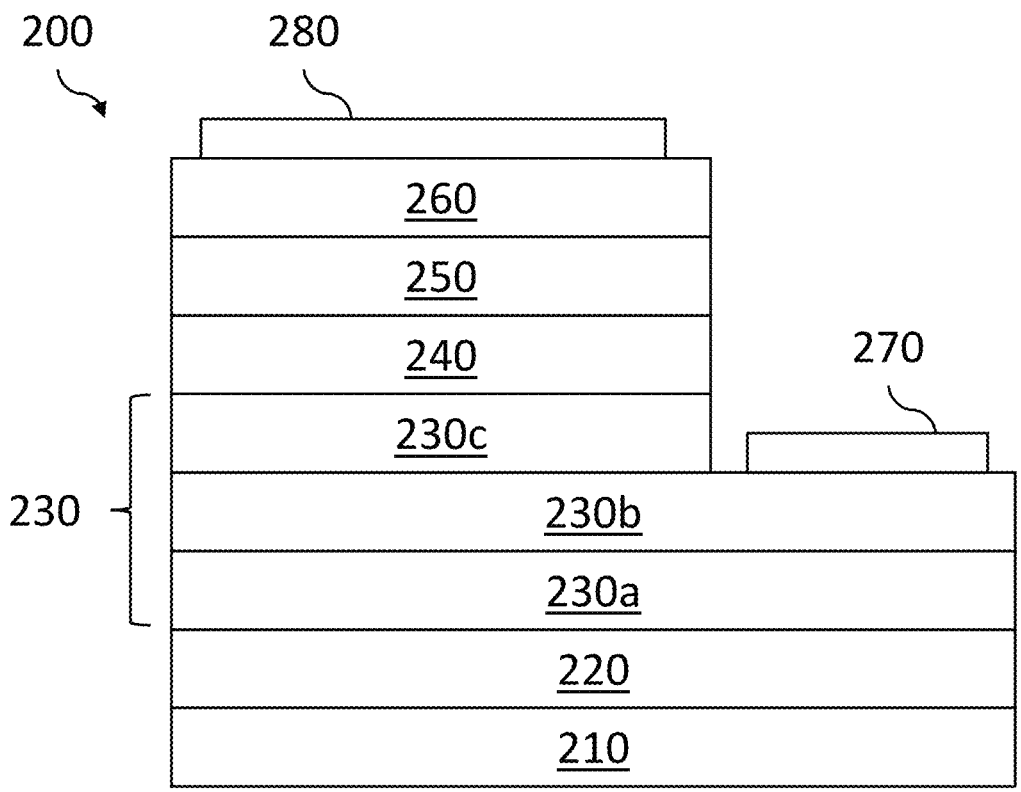
FIG. 2 shows a simplified schematic of a semiconductor light emitting structure incorporating a buried n-contact layer, in accordance with some embodiments.

FIG. 2 is a simplified schematic of a semiconductor light emitting structure 200 incorporating a buried n-contact layer (i.e., a second sub-layer) 230b, in accordance with some embodiments. The structure 200 contains a substrate 210, a buffer layer 220, a set of doped layers 230 (containing a first sub-layer 230a, a second sub-layer 230b, and a third sub-layer 230c), an active layer 240, an EBL 250, and a p-contact layer 260. In some embodiments, the buffer layer 220, the set of doped layers 230, the active layer 240, the EBL 250, and the p-contact layer 260 all comprise semiconductor materials, and the semiconductor materials can vary between different layers. In some embodiments, the set of doped layers 230, the first sub-layer 230a, the second sub-layer 230b, and the third sub-layer 230c are all doped n-type. In some embodiments, the second sub-layer 230b is doped n-type (e.g., using an extrinsic dopant like Si), and the first and/or third sub-layers 230a and/or 230c are not intentionally doped (i.e., no extrinsic dopant is intentionally added, but impurities can be unintentionally added which may in some cases acts as dopants). The structure is etched to form a mesa structure where the second sub-layer 230b is exposed and an n-metal 270 can make contact the second sub-layer 230b. Therefore, sub-layer 230b can be referred to as an n-contact layer. The p-metal 280 makes contact to the p-contact layer 260. The structure 200 can emit light, e.g., in the UVC wavelength band, or at a wavelength less than 300 nm, when an external bias is applied between the n-metal 270 and p-metal 280 contacts. In this case, the light is emitted from the active layer 240 and passes through the set of doped layers 230, the buffer layer 220 and the substrate 210 before being emitted from the structure 200. As described above, in some embodiments, sub-layer 230b has higher electrical conductivity (e.g., due to a higher doping density) than sub-layers 230a and 230c. In some embodiments, the sheet resistance of sub-layer 230b can be less than 10,000 ohms/square, or less than 1000 ohms/square, or from 10 ohms/square to 1000 ohms/square, or from 10 ohms/square to 10,000 ohms/square. In some embodiments, the sheet resistance of sub-layer 230b can be about 10 times, about 100 times, about 1000 times, or about 10,000 times higher than the sheet resistance of sub-layers 230a and/or 230c. The conductivity of the buried n-contact layer can vary (e.g., be higher or lower than the values listed above) depending on the materials used. For example, adding a buried n-contact layer with moderate conductivity (e.g., sheet resistance greater than about 1000 ohms/square or greater than about 10,000 ohms/square) to a conventional structure with very resistive (e.g., sheet resistance greater than about 10,000 ohms/square or greater than about 100,000 ohms/square) n-contact layer materials can be beneficial. Additionally, in some cases, sub-layer 230b has higher optical absorption at the wavelength emitted by the active layer 240 compared to sub-layers 230a and 230c.

In some embodiments, sub-layers 230a and 230b can switch positions, such that sub-layer 230b (the n-contact layer) is adjacent to the buffer layer 220, and sub-layer 230a is between sub-layers 230b and 230c. In some cases, layer 230a can be omitted from the structure 200. In such cases, the structure will contain a buffer layer 220 followed by the n-contact layer 230b, the sublayer 230c and the active layer 240. In some cases, layer 230c can be omitted from the structure 200. In such cases, the structure will contain a buffer layer 220 followed by the sublayer 230a, the n-contact layer 230b and the active layer 240. In some embodiments, the first and third sub-layers 230a and 230c have the same composition, thickness, and/or structures (in the case of multi-layer or superlattice sub-layers), while in some embodiments, the first and third sub-layers 230a and 230c have different composition, thickness, and/or structures (in the case of multi-layer or superlattice sub-layers) from each other.

The n-metal 270 can make contact with an upper surface (i.e., a surface of layer 230b opposite the substrate) of n-contact layer 230b, or the sub-layer 230b can be partially etched away and the n-metal can make contact to the interior of sub-layer 230b. In embodiments where the sub-layer 230b contains a superlattice, the n-metal 270 can make contact with a well or a barrier of the superlattice of sub-layer 230b. In some embodiments, the n-metal 270 makes contact with a layer within the superlattice of sub-layer 230b to yield the smallest possible Schottky n-barrier by making contact with a highly doped well layer within the superlattice of sub-layer 230b. In some embodiments sub-layer 230b contains a superlattice, the wells of the superlattice are very thin (e.g., approximately 1 monolayers (ML) thick, or less than 1 ML thick), and the etch process used to expose sub-layer 230b will etch sub-layer 230b to slightly different depths causing a slightly roughened, uneven, or otherwise non-uniform, exposed surface of sub-layer 230b. In such cases, it may be possible that the n-metal makes contact to both the well and the barrier at different lateral (i.e., parallel with the substrate surface) locations within the superlattice of sub-layer 230b.

Throughout this disclosure fractional monolayers, i.e., layers with thicknesses less than 1 ML, or layers with thicknesses equal to a fractional number of ML (e.g., 1.5 ML), are described. A fractional ML of a semiconductor with a thickness less than 1 ML can contain 3-dimensional islands of the semiconductor, and therefore the layer can be discontinuous. For example, a GaN well layer with a thickness less than 1 ML that is surrounded by AlN barriers on both sides can contain 3-dimensional islands of GaN that are surrounded by AlN. A fractional ML with a thickness greater than 1 ML can be described by the concatenation of a first layer containing an integer number of ML with a second fractional ML layer with a thickness less than 1 ML, where the second fractional ML layer with a thickness less than 1 ML has the properties described above.

In some cases, a superlattice (e.g., a short period superlattice (SPSL)) contains alternating layers of AlN and GaN and does not contain a ternary AlGaN layer, and the AlN and/or GaN layers contain less than 1 ML of AlN and/or GaN respectively. Therefore, in some regions (or nanoregions) of such a layer mixed compounds $Al_xGa_{1-x}N$ can still exist. Similarly, in some cases, a superlattice can have only GaN and AlN layers where the AlN and/or GaN layer thicknesses are non-integer numbers of MLs. In such cases, in some regions (or nanoregions) of the layer mixed compounds $Al_xGa_{1-x}N$ can still exist within the superlattice.

Substrate 210 can be many different materials, such as sapphire, SiC, AlN, GaN, silicon, or diamond. In some embodiments, the substrate 210 has a low absorption coefficient to the light emitted from the active layer 240 and/or has a lattice constant that is similar to the material forming the other layers of the epitaxial structure 200. In some embodiments, the substrate significantly absorbs light with the wavelengths of interest, and the substrate is thinned or removed during device processing. In some cases, the substrate is thinned locally to form windows for the light emitted from the active layer 240 to escape the structure.

In some embodiments, the buffer layer 220 is from 50 nm to 1000 nm thick, or from 50 nm to 5000 nm thick, and is composed of a semiconductor material that has a low absorption coefficient to the light emitted from the active layer 240 and a lattice constant that is similar to the material forming the other layers of the epitaxial structure 200. Some examples of materials that can be used for buffer layer 220 are AlN, AlGaN, and InAlGaN. Buffer layer 220 can be a single layer, multiple layers, or a superlattice in different embodiments.

In some embodiments, the set of doped layers 230 contain semiconductor epitaxial layers that are doped n-type. Some examples of materials for the set of doped layers 230 are GaN, AlN, AlGaN, and InAlGaN. Each of the sub-layers 230a, 230b and 230c in the set of doped layers 230 can have a thickness from less than about 10 nm to 3000 nm, or less than about 10 nm to 1000 nm, or from 100 nm to 1000 nm, or from 10 nm to 300 nm, or from 10 nm to 100 nm, or about 50 nm, or less than 50 nm, depending on the layer and the overall structure. In some embodiments sub-layer 230a is greater than 100 nm thick in order to improve the materials quality of the active layer 240. For example, a thick (e.g., greater than 100 nm, or from 100 nm to 500 nm, or from 100 nm to 1000 nm) sub-layer 230a can filter out threading dislocations before they are able to reach the active layer 240 and degrade the device performance. In some embodiments, sub-layer 230c has a thickness and a natural lattice constant (i.e., a relaxed or unstrained lattice constant) suitable to improve the strain matching and better confine electrons to the active layer 240. In some embodiments, the bandgaps or effective bandgaps of the sub-layers 230a and 230c are wider than the bandgap or effective bandgap of sub-layer 230b, causing sub-layer 230b to absorb more of the light emitted from the active layer 240. In some embodiments, the doping density of the sub-layers 230a and 230c are lower than the doping density of sub-layer 230b, causing sub-layer 230b to have a higher electrical conductivity. The higher electrical conductivity of sub-layer 230b can also be due to reasons unrelated to the doping density from an extrinsic dopant. For example, the electrical conductivity of sub-layer 230b can be higher than that of 230a and 230c due to polarization doping, the free carrier mobility, or other materials properties of the sub-layers, or due to the structure and/or dimensions of the sub-layers. Different configurations of the set of doped layers 230 are discussed further below.

In some embodiments, the active layer 240 contains semiconductor materials configured to emit light. In some embodiments, the active layer 240 can contain one or more narrower bandgap wells surrounded by wider bandgap barriers (e.g., in a quantum well structure, a superlattice, or a short-period superlattice (SPSL)), where the bandgaps and thicknesses of the wells and barriers are chosen to emit light with wavelengths less than 300 nm (e.g., in the UVC band). Some examples of materials for the wells and/or barriers of the active layer 240 are GaN, AlN, AlGaN, and InAlGaN. The active layer can have a thickness, for example, from less than about 10 nm to 1000 nm, or from 10 nm to 100 nm, or about 50 nm. In some embodiments, using a superlattice (or an SPSL) for the active layer 240 can be beneficial for light emission and/or light extraction efficiency from the structure.

In some embodiments, EBL 250 contains a wide bandgap semiconductor material configured to block electrons from leaving the active layer 240 and entering the p-contact layer 260. In some cases, the EBL layer 250 can be extrinsically doped p-type. In some cases, the EBL 250 can be undoped, or doped via a mechanism such as polarization doping. The EBL 250 can contain a single layer with a conduction band offset configured to confine electrons inside the active layer 240 or can contain multiple layers. In some embodiments, the EBL is a chirped SPSL with wells and barriers where the thickness of the wells and/or barriers is varied throughout the EBL 250. For example, the thicknesses of the wells can be linearly varied from a lower thickness (e.g., less than 1 ML, about 0.5 ML, or about 0.25 ML) adjacent to the active layer 240 to a higher thickness adjacent to the p-contact layer 260 (e.g., greater than 5 ML, or about 10 ML). The thickness of the barriers can be constant throughout the EBL layer 250 or can also vary. The EBL 250 can be a p-type chirped superlattice comprising changing well layer thicknesses, changing barrier layer thicknesses, or changing well layer and barrier layer thicknesses through the layer. The thickness of the EBL layer can be, for example, from 5 nm to 50 nm or be about 20 nm.

EBLs, including chirped EBLs for long wavelength LEDs are described more completely in International Patent Application Publication No. WO2019/193487, the entirety of which is incorporated herein by reference.

In some embodiments, the p-contact layer 260 is a material with a high conductivity to enable a low contact resistance between the p-metal and the active layer 240. The p-contact layer can be a narrow bandgap material (e.g., to provide a high electrical conductivity), or a wide bandgap material (e.g., to reduce secondary absorption of light emitted from the active layer 240). In some embodiments, the p-contact layer material has a bandgap that provides a low resistance contact and also a low absorption coefficient for the wavelength of light emitted from the structure. Some examples of materials for the p-contact layer 260 are GaN, AlN, AlGaN, and InAlGaN. The p-contact layer 260 is doped with a p-type dopant, such as Mg. The thickness of the p-contact layer can be, for example, from 10 nm to 100 nm, or about 40 nm. In some cases, the p-contact layer 260 can be a superlattice, for example, an SPSL with GaN wells and AlN barriers, or with AlGaN wells and barriers. In some cases, the p-contact layer 260 can have a graded composition, for example from a first to a second composition of $Al_xGa_{1-x}N$ throughout the layer.

The n-metal 270 and p-metal 280 can contain any combinations of metals that form ohmic contacts to the n-contact layer 230b and p-contact layer 260, respectively. Some examples of materials that can be used in the n-metal and/or p-metal are Ti, Al, Ta and Ni. For example, the n-metal and p-metal can include a layer of Ti adjacent to the n-contact layer 230b or p-contact layer 260, followed by a layer of Al. In some cases, the n-metal and p-metal contact layers each includes from 1 nm to 10 nm (or about 2 nm) of Ti deposited on the n-contact or p-contact layers 230b and 260, followed by from 20 nm to 400 nm of Al. The total thickness of the n-metal 270 and p-metal 280 can be from about 20 nm to about 400 nm.

In some embodiments, the set of doped layers 230 (including sub-layers 230a, 230b and 230c), the active layer 240, the EBL 250, and optionally the p-contact layer 260, are entirely composed of SPSLs made from alternating pairs of GaN wells and AlN barriers. In such cases, the thickness of the wells and/or barrier can be adjusted to tailor the effective bandgaps of each of the layers 230, 240, 250 and 260.

In some embodiments, the set of doped layers 230 (including sub-layers 230a, 230b and 230c), the active layer 240, the EBL 250, and then p-contact layer 260 are entirely composed of SPSLs where the average alloy content of each of the plurality of unit cells of the SPSLs (i.e., the repeat unit of the SPSL, e.g., GaN/AlN) is constant or non-constant along the growth direction. In some embodiments, the set of doped layers 230 (including sub-layers 230a, 230b and 230c) and the active layer 240 are entirely composed of SPSLs where the average alloy content of each of the plurality of unit cells of the SPSLs (i.e., the repeat unit of the SPSL, e.g., GaN/AlN) is constant or non-constant along the growth direction. The average alloy of content a simple unit cell comprising two compositions, such as a GaN layer of thickness $t_{GaN}$ and AlN layer of thickness $t_{AlN}$, is given by $x_{ave}=t_{AlN}/(t_{AlN}+t_{GaN})$, where the $x_{ave}$ represents the effective Al fraction of the pair in the unit cell. In alternative embodiments, the unit cells of the SPSLs can comprise three or more $Al_xGa_{1-x}N$ compositions and in such embodiments the effective alloy content can be similarly determined. The average alloy content of other layer compositions comprising binary, ternary and quaternary materials can be defined according to one or more elemental constituents. For example, layers 230, 240, 250 and 260 can contain SPSLs with tri-layered unit cells comprising the triple layers of $AlN/Al_xGa_{1-x}N/GaN$ or $AlN/Al_xGa_{1-x}N/Al_yIn_zGa_{1-y-z}N$ and the average alloy content (e.g., the Al fraction) in these unit cells can also be determined. Maintaining a constant average alloy content enables lattice matching of the effective in-plane lattice constant of the unit cells of dissimilar superlattices (e.g., in layers 230, 240, 250 and/or 260). In some embodiments, throughout the semiconductor structure, unit cells that are adjacent to one another have substantially the same average alloy content. In some embodiments, the average alloy content of each of the plurality of unit cells is constant in a substantial portion of the semiconductor structure 200.

The set of doped layers 230 can have different configurations. In some embodiments, sub-layers 230a, 230b and 230c are all single layers (e.g., single layers of semiconductor materials), and the bandgap of the second sub-layer 230b is lower than the bandgaps of the first sub-layer 230a and/or third sub-layer 230c. In other cases, the sub-layers 230a, 230b and 230c are all superlattices (e.g., superlattices containing wells of a first semiconductor material and barriers of a second semiconductor material), and the effective bandgap of the second sub-layer superlattice is lower than the effective bandgap of the first sub-layer 230a superlattice and/or third sub-layer 230c superlattice. In yet other cases, one or two of the sub-layers 230a, 230b and 230c are single layers, one or two of the sub-layers 230a, 230b and 230c contain superlattices, and the bandgap or the effective bandgap of the second sub-layer is lower than the bandgaps or the effective bandgaps of the first sub-layer 230a and/or third sub-layer 230c. Each of the sub-layers 230a, 230b and 230c, can have a bandgap, or an effective bandgap in the case of superlattices, that is constant throughout the sub-layer, or can vary throughout the sub-layer. Each of the sub-layers 230a, 230b and 230c, can have a composition, or an average composition of each unit cell (e.g., a well/barrier pair) in the case of superlattices, that is constant throughout the sub-layer, or can vary throughout the sub-layer. For example, the thickness of the wells and/or barriers within the superlattices of each of the sub-layers 230a, 230b and/or 230c can be constant or can change through the thickness of the sub-layer.

The thicknesses (i.e., in the growth direction perpendicular to the substrate 210 surface) of sub-layers 230a, 230b and 230c can all be the same or can be different from one another. The sub-layer 230a can have a thickness from 10 nm to 3000 nm, or from 10 nm to 1000 nm, or from 100 nm to 500 nm, or about 400 nm. The sub-layer 230b (i.e., n-contact layer 230b) can have a thickness from less than 10 nm to 100 nm, or about 50 nm, depending on the materials system. Sub-layer 230c is adjacent to the active layer 240 and can have a thickness from less than 10 nm to 100 nm, or about 50 nm. For example, sub-layer 230a can be thicker than sub-layer 230b and 230c, and sub-layer 230a can be about 400 nm thick. Sub-layer 230c can improve the strain matching in the structure and help confine electrons to the active region (e.g., since the bandgap or the effective bandgap is typically larger than sub-layer 230b), and therefore can have a thickness less than 50 nm. The thickness of sub-layer 230b is important because it governs the resistance and the optical absorption of the layer. In some embodiments, sub-layer 230b can be thinner than sub-layers 230a and/or 230c and can have a thickness from about 10 nm to about 100 nm, or from about 20 nm to about 100 nm. The thickness of the sub-layer 230b can be tailored to trade off turn-on and/or drive voltage with output power emitted from the structure, as described above.

Figure 3:
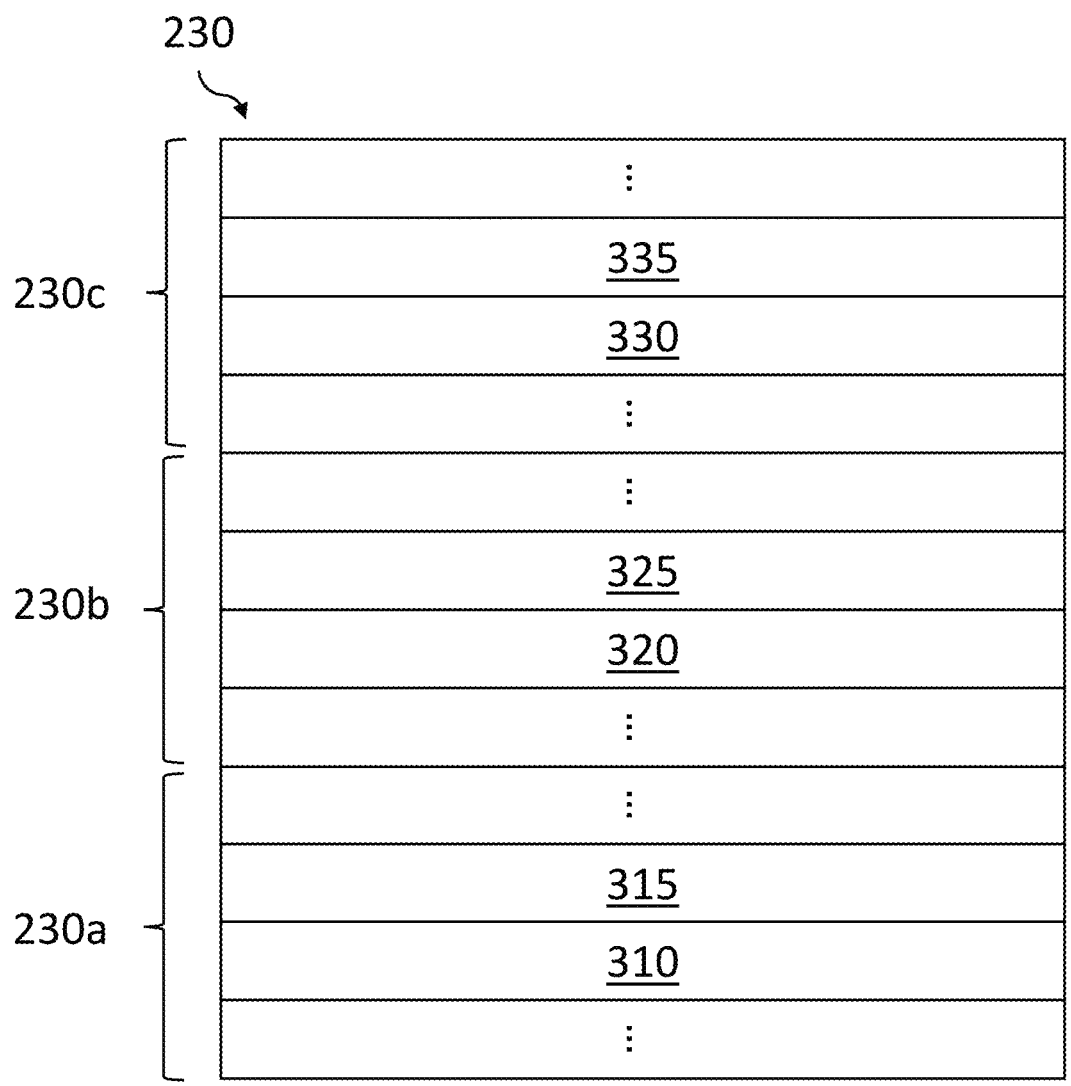
FIG. 3 shows a simplified schematic of an example of a set of doped layers containing a first, second and third sub-layer, in accordance with some embodiments.

FIG. 3 shows a simplified schematic of an example of the set of doped layers 230 containing sub-layers 230a, 230b and 230c, in accordance with some embodiments. In this example, the sub-layers 230a, 230b and 230c are all superlattices. The sub-layer 230a superlattice contains repeating pairs of wells 310 and barriers 315, the sub-layer 230b superlattice contains repeating pairs of wells 320 and barriers 325, and the sub-layer 230c superlattice contains repeating pairs of wells 330 and barriers 335. The number of repeating pairs of wells and barriers (i.e., repeat units) in sub-layers 230a, 230b and/or 230c can be small (e.g., about 10 repeat units for thin layers) to large (e.g., about a thousand repeat units or more for thicker layers). For example, sub-layers 230a, 230b and/or 230c can contain from about 10 to about 1000, or from about 10 to about 200, or from about 10 to about 100 repeat units. In some embodiments, the wells 320 and barriers 325 of sub-layer 230b superlattice are different compositions and/or thicknesses than the wells 310 and 330 and barriers 315 and 335 of the superlattices of sub-layers 230a and 230c.

FIG. 3 shows that there can be many repeating pairs of wells 310, 320 and 330 and barriers 315, 325 and 335, in each of the sub-layer superlattices. Additionally, each of the sub-layer superlattices can begin and end with either a well or a barrier. In some embodiments, however, there cannot be wells or barriers adjacent to each other between adjacent superlattices. In other words, in some embodiments, wells 310 and 320 of adjacent superlattices will have a barrier (either 315 or 325) between them, and wells 320 and 330 of adjacent superlattices will have a barrier (either 325 or 335) between them. Similarly, in some embodiments, barriers 315 and 325 of adjacent superlattices will have a well (either 310 or 320) between them, and barriers 325 and 335 of adjacent superlattices will have a well (either 320 or 330) between them.

The thickness of wells 310, 320 and 330 and barriers 315, 325 and 335 can vary depending on the materials used in these layers (and the other layers of the structure 200). In some embodiments, the wells 310, 320 and 330 can be from 0.1 ML to 10 ML, or from 0.1 ML to 4 ML, and the barriers can be from 2 ML to 20 ML.

In some embodiments, the set of doped layers 230 contains different compositions of $Al_xGa_{1-x}N$ (where x can be from 0 to 1) to form the wells 310, 320 and 330 and/or the barriers 315, 325 and 335. For example, the wells 320 can be $Al_xGa_{1-x}N$ with a lower Al content than that of wells 310 and 330. In this case, the sub-layer 230b will have a lower effective bandgap than sub-layers 230a and 230c due to the lower Al fraction in the wells 320. The lower Al content of the well 320 in the sub-layer 230b will enable that layer to be doped higher (e.g., with an extrinsic dopant such as Si) and have a higher electrical conductivity than the first sub-layer 230a and the third sub-layer 230c. However, the reduced effective bandgap of the sub-layer 230b caused by the lower Al content can also increase the optical absorption of the sub-layer 230b compared to the sub-layer 230a and the sub-layer 230c. In this example, by tuning the composition of the wells 320 of the sub-layer 230b and the total thickness of sublayer 230b, the performance degradation due to the increased absorption in the sub-layer 230b can be offset by the improved carrier injection, and the overall output power of the light emitted from the structure can be approximately the same or even improved compared to a structure where the wells 320 of sub-layer 230b have the same Al content as the wells 310 and 330 of the first sub-layer 230a and the third sub-layer 230c.

In some embodiments, the set of doped layers 230 contains different thicknesses (i.e., in the growth direction, perpendicular to the substrate 210 surface) of the wells 310, 320 and 330 and/or the barriers 315, 325 and 335. For example, the wells 320 can be thicker than the wells 310 and 330. In another example, the wells 320 can be thicker than the wells 310 and 330, and the barriers 325 can be thinner than the barriers 315 and 335. In another example, the wells 320 can be the same thickness as the wells 310 and 330, and the barriers 325 can be thinner than the barriers 315 and 335.

In all of these cases, the sub-layer 230b will have a lower effective bandgap than sub-layers 230a and 230c due to the thicker wells 320 and/or thinner barriers 325 reducing the confinement of carriers within the wells of sub-layer 230b, as discussed above. The lower effective bandgap of the sub-layer 230b will enable it to be doped higher (e.g., with an extrinsic dopant such as Si) and have a higher electrical conductivity than the first sub-layer 230a and the third sub-layer 230c. However, the reduced effective bandgap of the sub-layer 230b can also increase the optical absorption (at the wavelength emitted by active layer 240) of the sub-layer 230b compared to the sub-layer 230a and the sub-layer 230c. In this example, by tuning the thicknesses of wells 320 and/or barriers 325 of the sub-layer 230b and the total thickness of sublayer 230b, the performance degradation due to the increased absorption in the sub-layer 230b can be offset by the improved carrier injection, and the overall output power of the light emitted from the structure can be approximately the same or even improved compared to a structure where the wells 320 and/or barriers 325 of sub-layer 230b have the same thicknesses as the wells 310 and 330 and/or barrier 315 and 335 of the first sub-layer 230a and the third sub-layer 230c.

In some embodiments, both the compositions and the thicknesses of the wells 320 and/or barriers 325 of the sub-layer 230b are different than those of the wells 310 and 330 and the barriers 315 and 335 of the sub-layers 230a and 230c. In this case, the effective bandgap of sub-layer 230b can be made lower than the effective bandgap of sub-layers 230a and 230c due to the combination of lower bandgap compositions of the wells 320 and/or barriers 325 along with the thicker wells 320 and/or thinner barriers 325 compared to the wells 310 and 330 and/or barriers 315 and 335 in the sub-layers 230a and 230c. In some cases, the composition of the material making up the wells 320 of sub-layer 230b can change in such a way that the bulk bandgap of the material making up the wells 320 increases, while concurrently the well 320 thickness can be increased in such a way that the effective bandgap of the entire superlattice of sub-layer 230b can decrease. In other cases, the composition of the material making up the wells 320 of sub-layer 230b can change in such a way that the bulk bandgap of the material making up the wells 320 decreases, while concurrently the well 320 thickness can be decreased in such a way that the effective bandgap of the superlattice of sub-layer 230b can decrease. Similar to the above cases, by tuning the compositions and thicknesses of wells 320 and/or barriers 325 of the sub-layer 230b and the total thickness of sublayer 230b, the performance degradation due to the increased absorption in the sub-layer 230b can be offset by the improved carrier injection, and the overall output power of the light emitted from the structure can be approximately the same or even improved compared to a structure where the wells 320 and/or barriers 325 of sub-layer 230b have the same compositions and thicknesses as the wells 310 and 330 and/or barrier 315 and 335 of the first sub-layer 230a and the third sub-layer 230c.

In some embodiments, the LED structures described herein (e.g., with structures similar to structure 200 in FIG. 2) emit non-coherent light, with wavelengths less than 300 nm, or from 200 nm to 300 nm. In some embodiments, the LED structures described herein have total wall plug efficiency (i.e., the ratio of optical output power to consumed electrical input power) from 0.1% to 90%. In some embodiments, the LED structures described herein have total output power from 0.1 mW to 1 W. In some embodiments, the LED structures described herein have turn-on and/or operating voltages from 3 V to 10 V, or from 3 V to 20 V. In some embodiments, the LED structures described herein have operating voltages that are less than 60%, or less than 50%, or less than 40%, or less than 35%, or less than 30% of the operating voltages of similar LED structures that do not incorporate a buried n-contact layer. In some embodiments, the LED structures described herein have turn-on voltages that are less than 60%, or less than 50%, or less than 40%, or less than 35%, or less than 30% of the turn-on voltages of similar LED structures that do not incorporate a buried n-contact layer. In some embodiments, the LED structures described herein have output powers that are improved by greater than 100%, or greater than 80%, or greater than 60%, or greater than 40%, or greater than 20%, or greater than 10%, compared to the output powers of similar LED structures that do not incorporate a buried n-contact layer. In some embodiments, the LED structures described herein have a wall plug efficiency (WPE) that is improved by greater than 1000%, or greater than 750%, or greater than 500%, or greater than 400%, or greater than 300%, or greater than 200%, or greater than 100%, or greater than 50%, compared to the WPE of similar LED structures that do not incorporate a buried n-contact layer. In some embodiments, the output power of the LED structures described herein have output powers that are approximately the same as, or even less than, the output powers of similar LED structures that do not incorporate a buried n-contact layer, however, the WPE of the structures are improved due to an improved operating voltage.

EXAMPLES

Figure 4A:
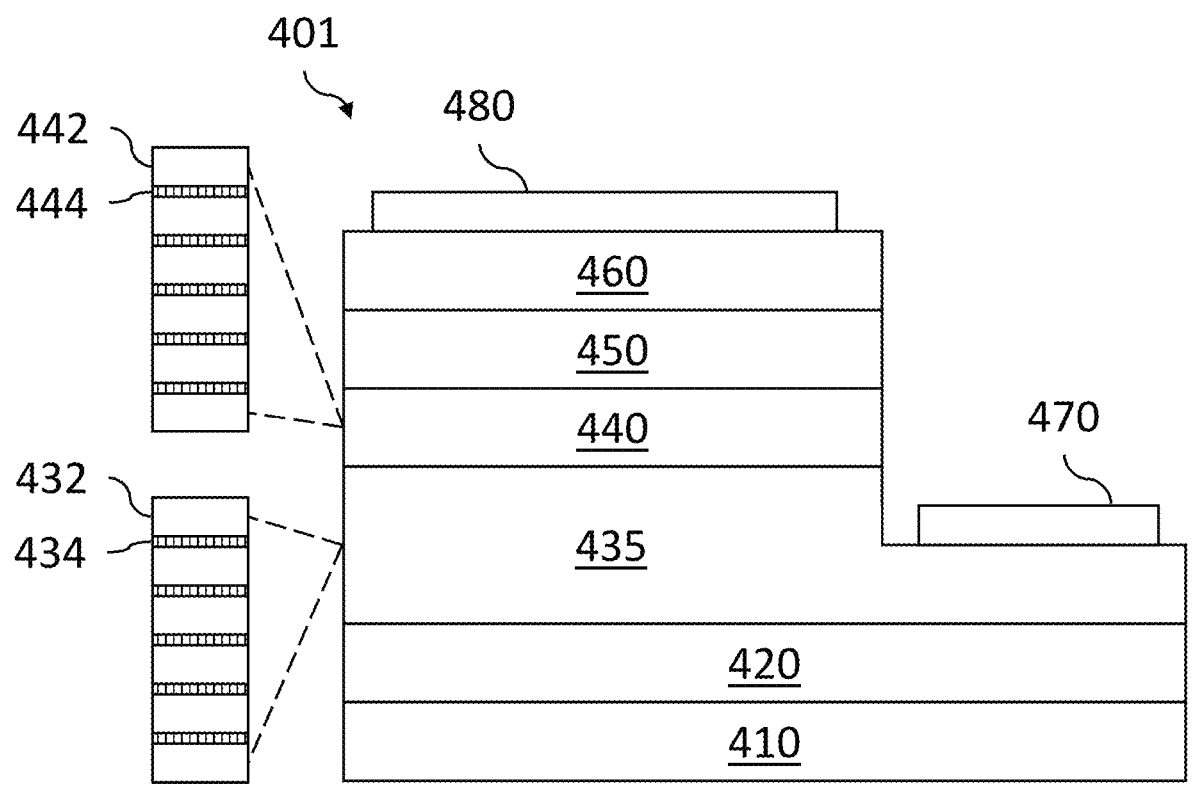
FIG. 4A shows a simplified schematic of a semiconductor light emitting diode structure without a buried n-contact layer.
Figure 4B:
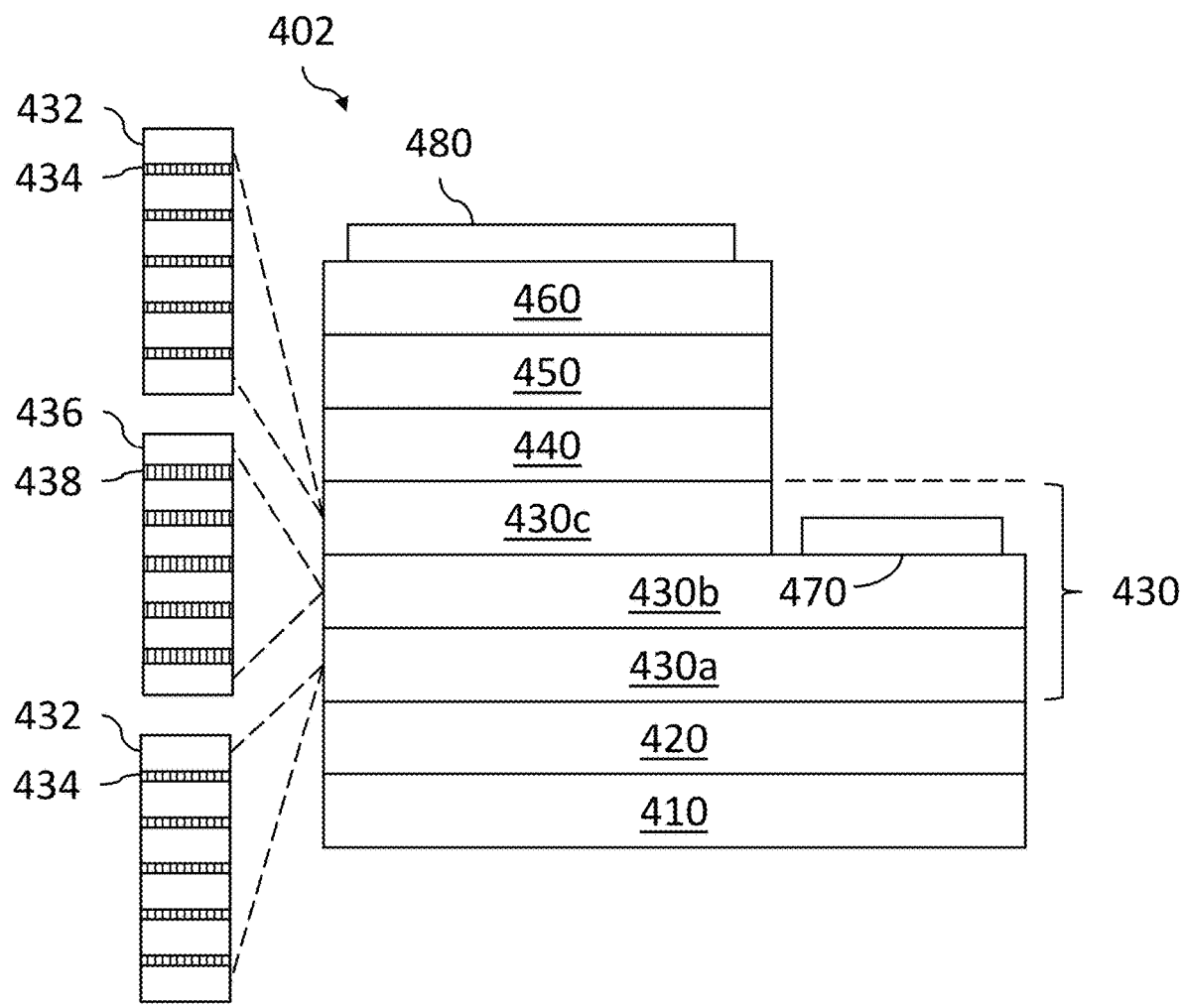
FIG. 4B shows a simplified schematic of a semiconductor light emitting diode structure with a buried n-contact layer, in accordance with some embodiments.

FIGS. 4A and 4B show simplified schematics of two UVC LED structures 401 and 402, respectively, with epitaxial layers fabricated using MBE, mesas etched using dry etching, and metal contacts deposited by evaporation. FIGS. 4A and 4B both contained a substrate 410, a buffer layer 420, an active layer 440, an EBL layer 450, a p-contact layer 460, an n-metal 470, and a p-metal 480. However, FIG. 4A illustrates a baseline structure (i.e., a control structure) that incorporated a single n-contact layer 435, and FIG. 4B illustrates an improved structure that incorporated a set of doped layers 430. Layers 430 contained a first sub-layer 430a, a second sub-layer 430b (that functions as a buried n-contact layer 430b), and a third sub-layer 430c. Structures 401 and 402 both emit approximately 233 nm UV light through the substrate rather than through the p-side of the structure, which is advantageous because little of the emitted light is absorbed or blocked by the metal contacts 470 and 480.

In both structures 401 and 402, the substrate 410 was sapphire, and buffer layer 420 was a 400 nm thick AlN buffer layer. Both structures 401 and 402 also incorporated the same active layers 440, which were 50 nm thick layers of an undoped (i.e., no dopants were intentionally added during layer growth) short period superlattice (SPSL). The SPSL of active layer 440 contained repeating pairs of GaN wells 444 and AlN barriers 442, where the GaN wells 444 and the AlN barriers 442 had thicknesses such that the active layer 440 in both structures 401 and 402 emit UV light with a wavelength of approximately 233 nm. The EBL layer 450 of both structures 401 and 402 was a 20 nm thick chirped SPSL EBL, which contained GaN wells and AlN barriers where the thickness of the GaN wells was linearly varied throughout the layer 450. The p-contact layer 460 for both structures 401 and 402 was a 40 nm thick GaN layer p-doped with Mg to provide sufficient holes. The n- and p-metal contact layers 470 and 480 in both structures 401 and 402 were Ti/Al layers, that were deposited after the LED mesa structure was created by etching through the upper layers (i.e., 460, 450, 440, and either part of 435 or 430c) of the structures.

The n-contact layer 435 in structure 401 was a 400 nm thick SPSL with alternating GaN wells 434 and AlN barriers 432. In this example, the GaN wells 434 and AlN barriers 432 are the same thicknesses as the GaN wells 444 and AlN barriers 442, respectively, in the active layer 440. The n-contact layer 435 was doped with Si to make the layer conductive. The sheet resistance of the n-contact layer 435 was from about $5 \times 10^4$ ohms/square to about $2 \times 10^5$ ohms/square. The relatively high sheet resistance through the n-contact layer 435 led to a relatively high turn-on voltage and drive voltage required to achieve 100 mA of current injection, as discussed below. Note that the n-contact layer 435 has the same SPSL well and barrier compositions and thicknesses as the active layer. However, the n-contact layer 435 does not absorb a significant amount of the light from the active layer because the emission energy is higher than the energy of the absorption edge for such SPSLs.

The set of doped layers 430 in structure 402 contains three SPSL sub-layers: a 400 nm thick SPSL sub-layer 430a, a 50 nm thick sub-layer 430b (i.e., the n-contact layer 430b), and a 30 nm thick SPSL sub-layer 430c, each containing GaN wells and AlN barriers. The set of doped layers 430 are also all doped n-type with Si. In improved structure 402, the n-contact layer 430b was made more conductive by changing the thicknesses of the GaN wells and AlN barriers compared to the well and barrier thicknesses in sub-layers 430a and 430c. In layers 430a and 430c the GaN well 434 thicknesses and the AlN barrier 432 thicknesses were the same as those in the n-contact layer 435 in FIG. 4A. However, in layer 430b the GaN well 438 thickness was about 4 times thicker than the GaN well 434 thicknesses in layers 430a and 430c in FIG. 4B (and 435 in FIG. 4A) and the AlN barrier 436 thicknesses were about half as thick as the AlN barrier 432 thicknesses in layers 430a and 430c in FIG. 4B (and 435 in FIG. 4A). The wider GaN well 438 thicknesses and narrower AlN barrier 436 thicknesses in sub-layer 430b compared to those in sub-layers 430a and 430c allowed sub-layer 430b to be more conductive than sub-layers 430a and 430c. The sheet resistance of sub-layer 430b was from about 100 ohms/square to about 300 ohms/square, or about two to three orders of magnitude more conductive than sub-layers 430a and 430c.

The improved design of n-contact layer 430b in structure 402 compared to that of n-contact layer 435 in structure 401 reduced the turn-on voltage and the drive voltage required to achieve 100 mA of current injection significantly, as described below. However, due to the wider wells 438 and narrower barriers 436 of n-contact layer 430b in structure 402 compared to those of n-contact layer 435 in structure 401, n-contact layer 430b absorbed a significant amount of the light emitted from active layer 440, as shown in the following data. Surprisingly, the output power from structure 402 was also improved compared to that of structure 401, as shown in the following data. Not to be limited by theory, the output power may have been improved because the thickness of the n-contact layer 430b, and the thicknesses of the GaN wells 438 and the AlN barriers 436 within the layer, were tuned such that the reduced resistance of n-contact layer 430b improved the output power of the structure 402 more than the absorption in the layer reduced the output power, as discussed further below. In other words, even though sub-layer 430b absorbed light from the active layer, the improved structure of n-contact layer 430b improved the turn-on voltage, the drive voltage during operation, and the power output from structure 402 compared to those of 401.

Figure 5A:
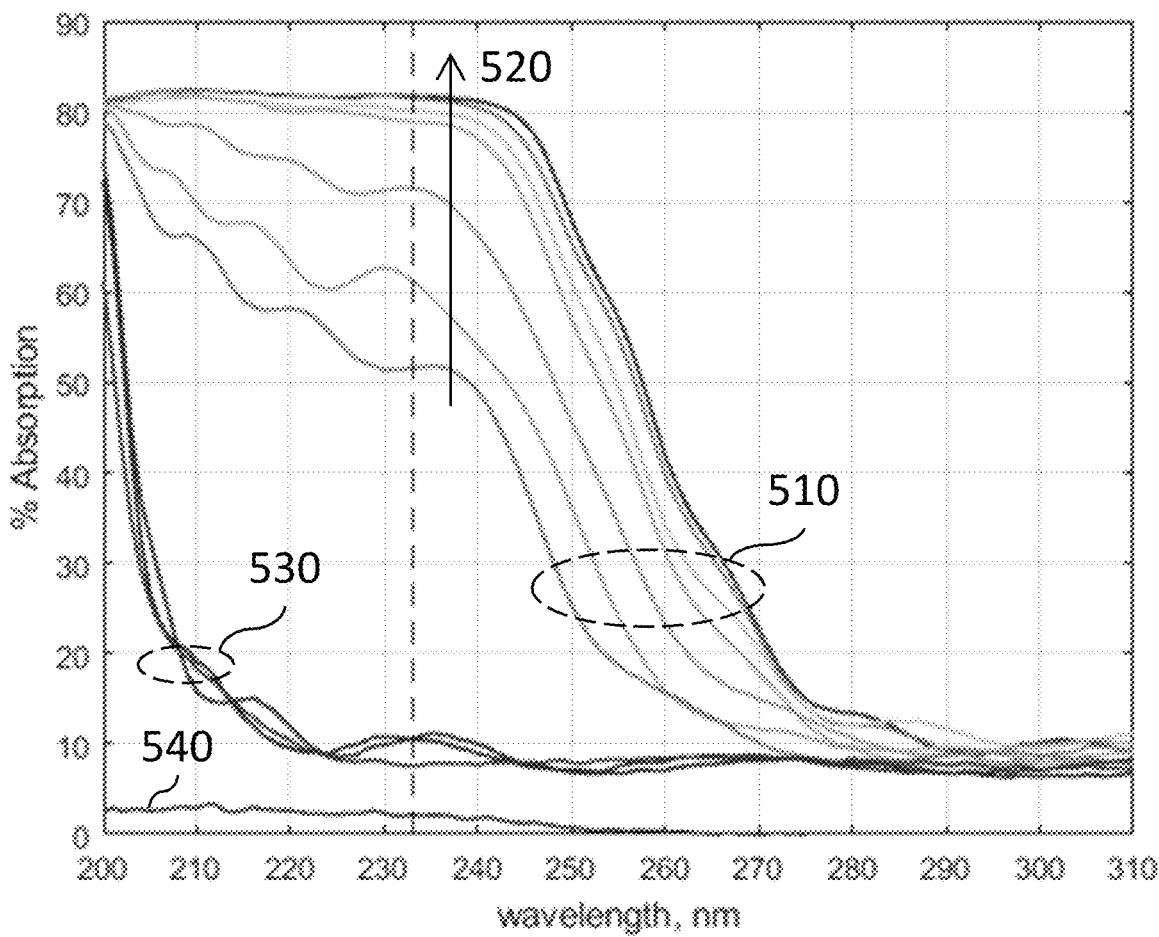
FIG. 5A shows measurements of absorption spectra from short period superlattices (SPSLs) with different total thicknesses, in accordance with some embodiments.

FIG. 5A shows measurements of absorption spectra 510 from SPSLs with different total thicknesses, each with the same structure as n-contact layer 430b in FIG. 4B (i.e., with GaN wells 438 and AlN barriers 436). A 405 nm thick SPSL was grown on a sapphire substrate with a thick AlN buffer layer. The thick SPSL was sequentially measured, thinned via etching, and measured again, to produce the seven absorption spectra 510. The y-axis of the plot in FIG. 5A is percent absorption, and the x-axis is wavelength in nm. The thicknesses of the SPSL samples that produced the absorption spectra 510 were 71 nm, 97 nm, 151 nm, 253 nm, 301 nm, 352 nm, and 405 nm. The absorption of the thicker SPSL layers at 233 nm was higher, as shown by arrow 520. FIG. 5A also shows the absorption spectra 530 of three different thicknesses of AlN layers, which shows that AlN layers (with similar thicknesses as used in the SPSLs measured to produce absorption spectra 510) absorb about 10% of the light at 233 nm. FIG. 5A also shows absorption data 540 for the sapphire substrate, which shows that the substrate absorbs a minimal amount of light at 233 nm.

Figure 5B:
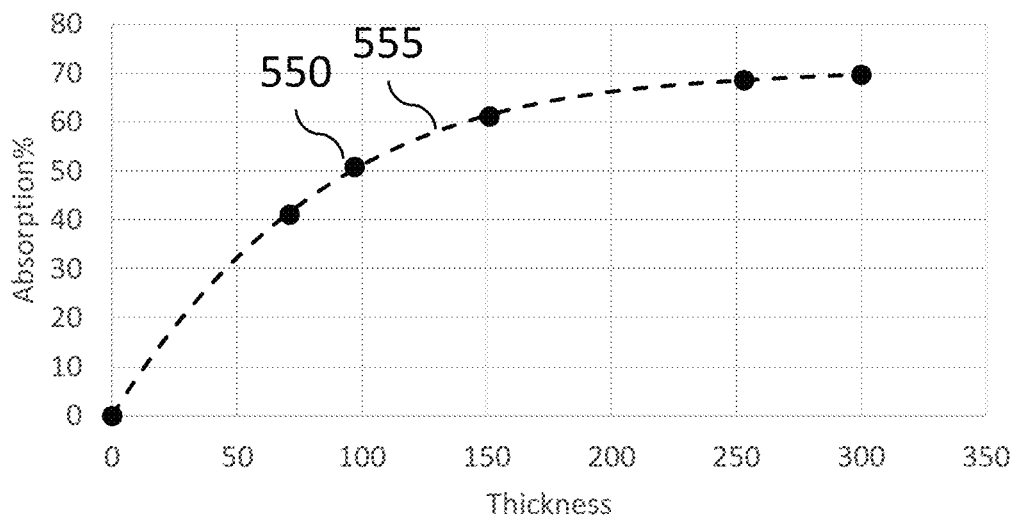
FIG. 5B shows a plot with measurements of absorption at 233 nm from SPSLs with different total thicknesses, in accordance with some embodiments.

FIG. 5B shows absorption data 550 of the SPSLs measured in FIG. 5A at a wavelength of 233 nm, and a polynomial fit 555 of the absorption data, as a function of thickness. The y-axis of the plot in FIG. 5B is percent absorption of the SPSL, and the x-axis is the thickness of the SPSL in nm. To arrive at the absorption data 550, which is the absorption of just the SPSL, the absorption from the thick AlN layer (i.e., about 10% at 233 nm) and substrate were removed from the experimental absorption data at 233 nm shown in FIG. 5A. FIG. 5B shows that the estimated absorption of such an SPSL can be reduced from about 70% absorption at an SPSL thickness of 300 nm down to about 30% absorption with an SPSL thickness of 50 nm.

FIGS. 6A-6E show experimental data from structures 401 and 402 to illustrate the effect of the buried n-contact layer 430b in reducing of the drive voltage and improving the output power. The lateral dimensions (i.e., parallel to a surface of the substrate) of the structures tested were 930 microns×930 microns.

Figure 6A:
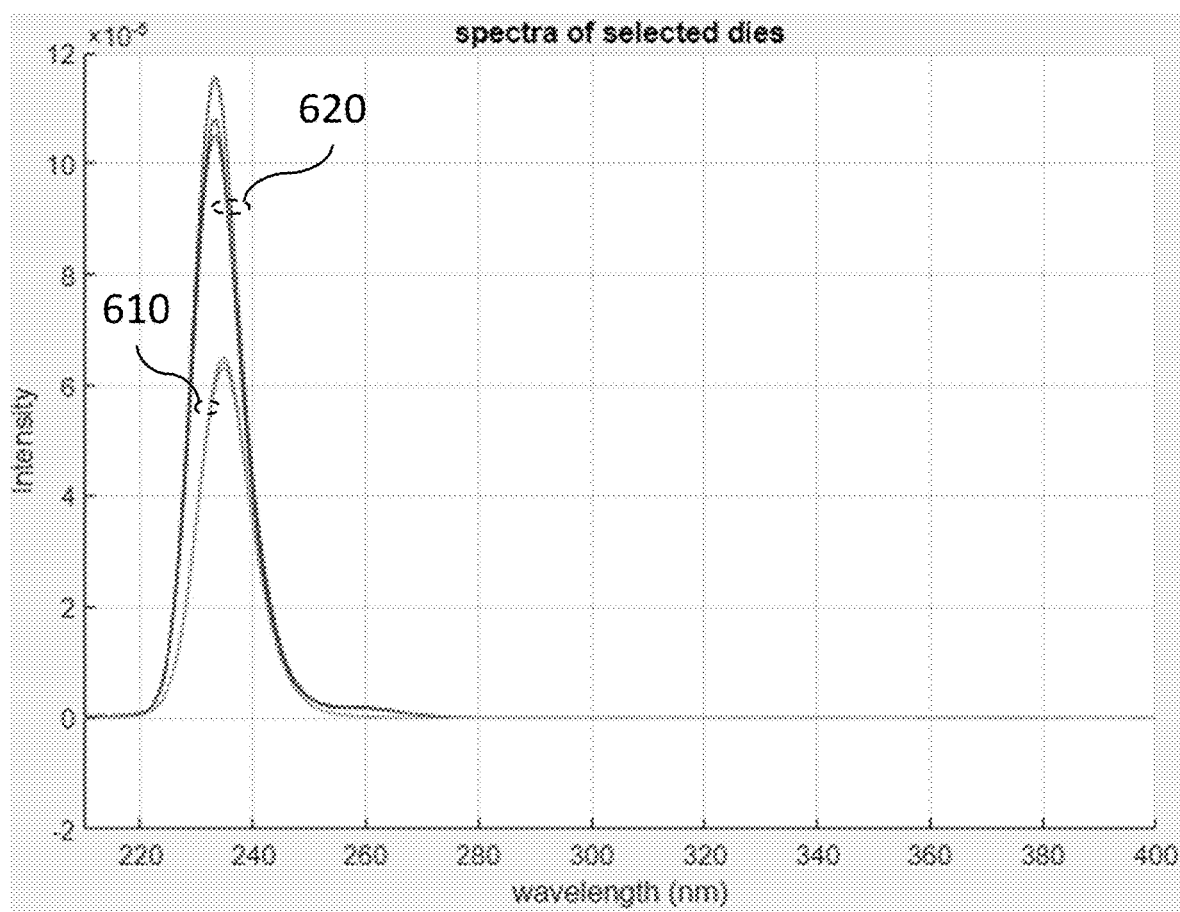
FIG. 6A shows a plot with measurements of emission spectra from structures with and without a buried n-contact layer, in accordance with some embodiments.

FIG. 6A shows emission spectra from structures 401 and 402, including three spectra 610 from three structures 401 (without a buried n-contact layer) and three spectra 620 from three structures 402 (with the buried n-contact layer 430b). The y-axis is spectral flux in units of W/nm, and the x-axis is wavelength in nm. The spectra 610 and 620 all have similar peak emission wavelengths. Surprisingly, the spectra 620 from structure 402 (with the buried n-contact layer 430b) show higher output intensity compared to the spectra 610 from structure 401 (without a buried n-contact layer).

Figure 6B:
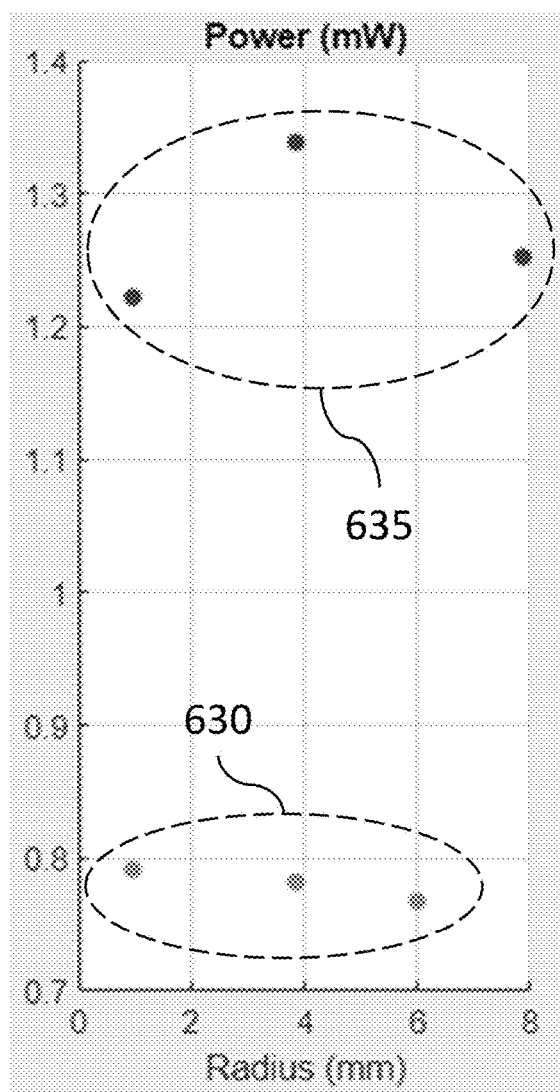
FIG. 6B shows a plot with power output from structures with and without a buried n-contact layer, in accordance with some embodiments.

FIG. 6B shows the output power 630 from three structures 401 (without a buried n-contact layer) and the output power 635 from three structures 402 (with the buried n-contact layer 430b). The y-axis is output power in mW, and the x-axis is the radius in mm of the position on the wafer at which the structure was tested. This plot shows that the incorporation of a buried contact layer with higher conductivity, but also higher optical absorption, into a UVC LED structure improves the output power from about 0.8 mW to about 1.2 mW or about 1.3 mW, which is an improvement of about 60%.

Figure 6C:
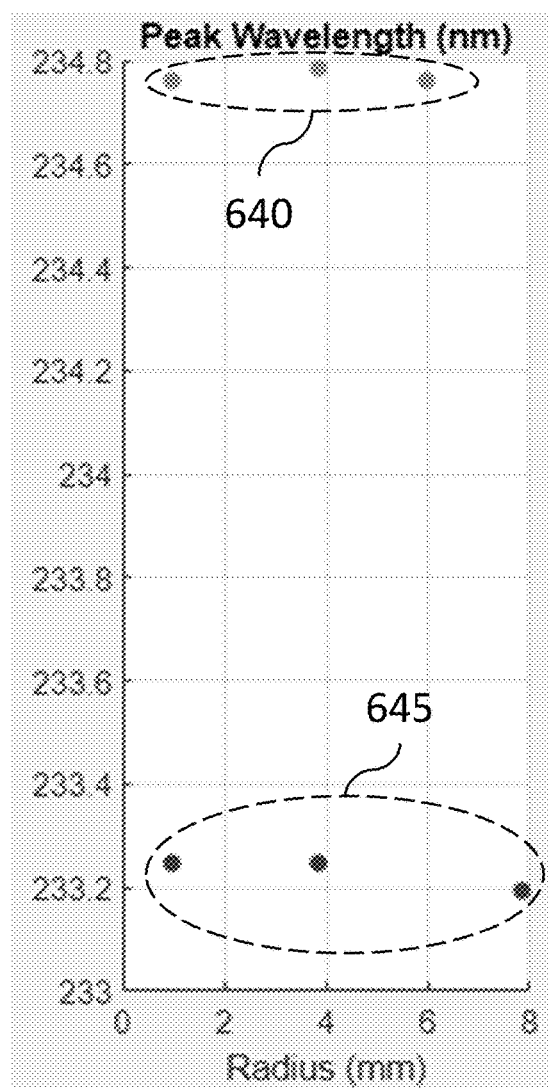
FIG. 6C shows a plot with peak emission wavelength from structures with and without a buried n-contact layer, in accordance with some embodiments.

FIG. 6C shows the peak emission wavelength 640 from three structures 401 (without a buried n-contact layer) and the peak emission wavelength 645 from three structures 402 (with the buried n-contact layer 430b). The y-axis is peak emission wavelength in nm, and the x-axis is the radius in mm of the position on the wafer at which the structure was tested. All of the peak emission wavelengths are between 233 nm and 235 nm. The variation in the peak emission 640 compared to 645 (i.e., less than 2 nm) is consistent with typical variation observed between different epitaxial growths of semiconductor structures with the same designs, showing that the buried contact layer does not significantly impact the wavelength produced. It is also notable that in this example, even though the peak emission wavelength 645 is shorter than the peak emission wavelength 640, the device with the buried n-contact layer 430b has brighter emission (e.g., as shown in FIG. 6B), which confirms that the higher output power is due to the different n-contact design and is not due to an artifact from a wavelength difference.

Figure 6D:
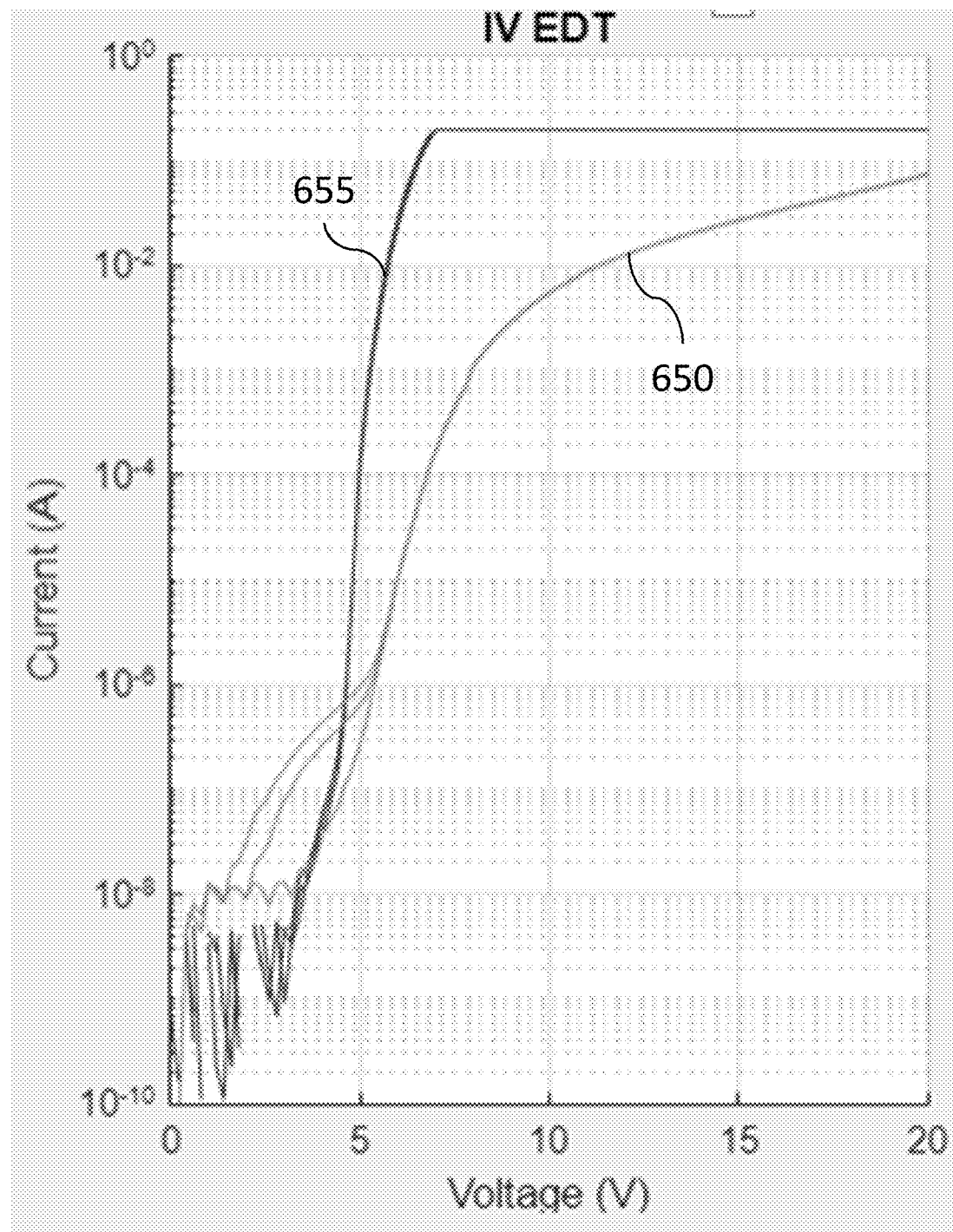
FIG. 6D shows a plot with current-voltage (IV) curves from structures with and without a buried n-contact layer, in accordance with some embodiments.
Figure 6E:
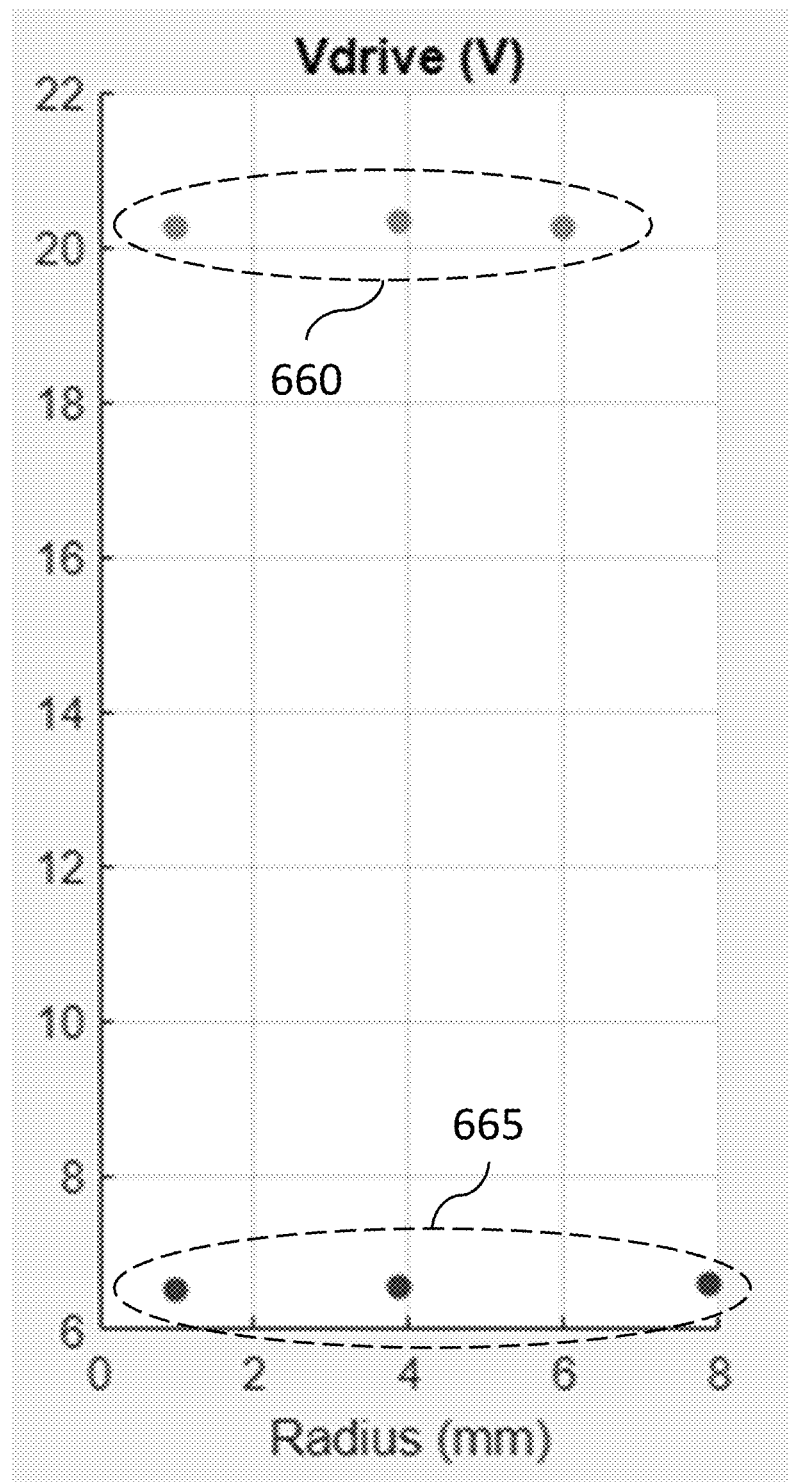
FIG. 6E shows a plot with operating (i.e., drive) voltage at 100 mA injected current from structures with and without a buried n-contact layer, in accordance with some embodiments.

FIG. 6D shows the current-voltage (IV) response 650 from three structures 401 (without a buried n-contact layer) and the IV response 655 from three structures 402 (with the buried n-contact layer 430b). The y-axis is the current in amperes and the x-axis is the voltage in volts. Note that the current of the IV response 655 from the three structures 402 saturated at a current compliance limit of 200 mA of the measurement hardware beyond a voltage of about 7 V. FIG. 6E shows the drive voltage 660 required for the three structures 401 (without a buried n-contact layer) and the drive voltage 665 required for three structures 402 (with the buried n-contact layer 430b) to reach 100 mA injected current. The y-axis is drive voltage in volts (at 100 mA), and the x-axis is the radius in mm of the position on the wafer at which the structure was tested. FIGS. 6D-6E demonstrate that the insertion of the buried layer reduced the drive voltage at 100 mA (i.e., voltage required to drive the device at 100 mA) from about 20 V to about 6.5 V. Due to the improved output power and the lower operating voltages, the WPE increased from about 0.04% for the structures 401 (FIG. 4A) to about 0.18% for the structures 402 (FIG. 4B) with the buried n-contact layer 430b, which was an increase of about 400%.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only and is not intended to limit the invention.

What is claimed is:
1. A light emitting structure, comprising:
 a layered stack comprising a first set of doped layers, a second layer, a light emitting layer positioned between the first set of doped layers and the second layer, and an electrical contact to the first set of doped layers, wherein:

the first set of doped layers, the second layer, and the light emitting layer comprise semiconductor materials;

the first set of doped layers comprises a first sub-layer, a second sub-layer, and a third sub-layer, the third sub-layer being adjacent to the light emitting layer;

the first, second and third sub-layers comprise a first, second and third superlattice, respectively;

well layers of the second superlattice are thicker than well layers of the first and third superlattices;

barrier layers of the second superlattice are thinner than barrier layers of the first and third superlattices;

the electrical contact to the first set of doped layers is made to the second sublayer;

the first, second and third sub-layers are doped n-type;

an electrical conductivity of the second sub-layer is higher than an electrical conductivity of the first and third sub-layers;

the light emitting layer comprises a fourth superlattice;

the second layer comprises a fifth superlattice; and the fifth superlattice is a chirped superlattice comprising changing well layer thicknesses, changing barrier layer thicknesses, or changing well layer and barrier layer thicknesses through the fifth superlattice.

2. The light emitting structure of claim 1, wherein:

light with a wavelength shorter than 300 nm that is emitted from the light emitting layer passes through the first set of doped layers before being emitted from the light emitting structure; and the second sub-layer absorbs from 10% to 60% of the light emitted from the light emitting layer that reaches the second sub-layer.

3. The light emitting structure of claim 1, wherein the well layers of the second superlattice comprise materials with lower bandgaps than the well layers of the first and third superlattices.

4. The light emitting structure of claim 1, wherein the first, second, third, fourth, and fifth superlattices each comprise sets of GaN well layers and AlN barrier layers.

5. The light emitting structure of claim 1, wherein the chirped superlattice is a p-type chirped superlattice comprising changing well layer thicknesses, changing barrier layer thicknesses, or changing well layer and barrier layer thicknesses through the fifth superlattice.

6. A light emitting structure, comprising:

a layered stack comprising a first set of doped layers, a second layer, a light emitting layer positioned between the first set of doped layers and the second layer, and an electrical contact to the first set of doped layers, wherein:

the first set of doped layers, the second layer, and the light emitting layer comprise semiconductor materials;

the first set of doped layers comprises a first sub-layer, a second sub-layer, and a third sub-layer, the third sub-layer being adjacent to the light emitting layer;

the electrical contact to the first set of doped layers is made to the second sublayer;

the first, second and third sub-layers are doped n-type;

an electrical conductivity of the second sub-layer is higher than an electrical conductivity of the first and third sub-layers;

the first, second and third sub-layers comprise a first, second and third superlattice, respectively;

the light emitting layer comprises a fourth superlattice;

the second layer comprises a fifth superlattice;

the first, second, third, fourth, and fifth superlattices each comprise sets of GaN well layers and AlN barrier layers; and the fifth superlattice is a chirped superlattice comprising changing well layer thicknesses, changing barrier layer thicknesses, or changing well layer and barrier layer thicknesses through the fifth superlattice.

7. The light emitting structure of claim 6, wherein:

light with a wavelength shorter than 300 nm is emitted from the light emitting layer and passes through the first set of doped layers before being emitted from the light emitting structure; and the second sub-layer absorbs from 10% to 60% of the light emitted from the light emitting layer that reaches the second sub-layer.

8. The light emitting structure of claim 6, wherein well layers of the second superlattice are thicker than well layers of the first and third superlattices.

9. The light emitting structure of claim 6, wherein the chirped superlattice is a p-type chirped superlattice comprising changing well layer thicknesses, changing barrier layer thicknesses, or changing well layer and barrier layer thicknesses through the fifth superlattice.

* * * * *